United States Patent
Gardner et al.

[11] Patent Number: 6,087,705
[45] Date of Patent: Jul. 11, 2000

[54] TRENCH ISOLATION STRUCTURE PARTIALLY BOUND BETWEEN A PAIR OF LOW K DIELECTRIC STRUCTURES

[75] Inventors: Mark I. Gardner, Cedar Creek; H. Jim Fulford, Jr.; Charles E. May, both of Austin, all of Tex.

[73] Assignee: Advanced Micro Devices, Inc., Sunnyvale, Calif.

[21] Appl. No.: 09/195,592

[22] Filed: Nov. 18, 1998

Related U.S. Application Data

[62] Division of application No. 08/994,143, Dec. 19, 1997.

[51] Int. Cl.$^7$ .............................. H01L 29/00; H01L 23/58
[52] U.S. Cl. ..................... 257/510; 438/424; 438/296; 257/644; 257/650; 257/501
[58] Field of Search .......................... 257/510, 639–644, 257/650; 438/424, 296, 229–232, 203

[56] References Cited

U.S. PATENT DOCUMENTS

| | | |
|---|---|---|
| 4,356,211 | 10/1982 | Riseman . |
| 5,130,268 | 7/1992 | Liou et al. . |
| 5,447,884 | 9/1995 | Fahey et al. . |
| 5,472,894 | 12/1995 | Hsu et al. . |
| 5,625,217 | 4/1997 | Chau et al. . |
| 5,661,335 | 8/1997 | Anjum et al. . |
| 5,702,976 | 12/1997 | Schuegraf et al. . |
| 5,726,090 | 3/1998 | Jang et al. . |
| 5,753,562 | 5/1998 | Kim . |
| 5,795,811 | 8/1998 | Kim et al. ................................ 438/404 |
| 5,804,491 | 9/1998 | Ahn . |
| 5,811,347 | 9/1998 | Gardner et al. . |
| 5,849,625 | 12/1998 | Hsue et al. ................................ 438/424 |
| 5,858,830 | 1/1999 | Yoo et al. ................................ 438/241 |
| 5,858,869 | 1/1999 | Chen et al. ................................ 438/597 |
| 5,874,328 | 2/1999 | Liu et al. ................................ 438/199 |
| 5,882,983 | 3/1999 | Gardner et al. . |
| 5,888,880 | 3/1999 | Gardner et al. . |
| 5,909,628 | 6/1999 | Chatterjee et al. . |
| 5,943,585 | 8/1999 | May et al. . |

FOREIGN PATENT DOCUMENTS 3-290961  12/1991  Japan ..................................... 257/510

OTHER PUBLICATIONS

Wolf et al., *Silicon Processing for the VLSI Era*, vol. 1, Lattice Press, 1986, pp. 198–199.

*Primary Examiner*—Mahshid Saadat
*Assistant Examiner*—Jesse A. Fenty
*Attorney, Agent, or Firm*—Kevin L. Daffer; Conley, Rose & Tayon

[57] ABSTRACT

A process is provided for forming dielectric structures having a relatively low dielectric constant arranged adjacent to the opposed lateral edges of a trench isolation structure. In an embodiment, an opening is etched vertically through a masking layer arranged upon a semiconductor substrate, thereby exposing the surface of the substrate. A patterned photoresist layer is formed upon the masking layer using optical lithography to define the region to be etched. Sidewall spacers made of a low K dielectric material are formed upon the opposed sidewall surfaces of the masking layer within the opening. The sidewall spacers are formed by CVD depositing a dielectric material within the opening and anisotropically etching the dielectric material until only a pre-defined thickness of the material remains upon the masking layer sidewall surfaces. Thereafter, a trench defined between the exposed lateral edges of the sidewall spacers is formed within the substrate. The sidewall spacers permit the lateral width of the trench to be reduced below the minimum lateral dimension definable using lithography. A trench dielectric is formed within the trench such that the upper portion of the dielectric is bound by the sidewall spacers on opposite ends. The resulting trench isolation structure is less likely to experience current leakage when operating an ensuing integrated circuit which employs the isolation structure.

11 Claims, 4 Drawing Sheets

TRENCH ISOLATION STRUCTURE PARTIALLY BOUND BETWEEN A PAIR OF LOW K DIELECTRIC STRUCTURES

This application is a divisional application of U.S. patent application Ser. No. 08/994,143 filed Dec. 19, 1997.

BACKGROUND OF THE INVENTION

1. Field of the Invention

This invention relates to integrated circuit fabrication and, more particularly, to dielectric structures having a relatively low dielectric constant arranged adjacent to the opposed lateral edges of a trench isolation structure to enhance the reliability of the integrated circuit employing the dielectric structures.

2. Description of the Relevant Art

The fabrication of an integrated circuit involves forming numerous devices in active areas of a semiconductor substrate. Select devices are interconnected by conductors which extend over a dielectric that separates or "isolates" those devices. Implementing an electrical path across a monolithic integrted circuit involves selectively connecting devices which are isolated from each other. When fabricating integrated circuits, it is therefore necessary to isolate devices built into the substrate from one another. From this perspective, isolation technology is one of the critical aspects of fabricating a functional integrated circuit.

A popular isolation technology used for a MOS integrated circuit is a technique known as the "shallow trench process". Conventional trench processes involve the steps of etching a silicon-based substrate surface to a relatively shallow depth, e.g., between 0.2 to 0.5 microns, and then refilling the shallow trench with a deposited dielectric. The trench dielectric is then planarized to complete formation of a trench isolation structure in field regions of the substrate. The trench isolation structure is formed during the initial stages of integrated circuit fabrication, before source and drain implants are placed in device areas or active areas. Trench isolation processing serves to prevent the establishment of parasitic channels in the field regions between active areas. The trench process is becoming more popular than the local oxidation of silicon process ("LOCOS"), another well known isolation technique. The shallow trench process eliminates many of the problems associated with LOCOS, such as bird's-beak and channel-stop dopant redistribution problems. In addition, the trench isolation structure is fully recessed, offering at least a potential for a planar surface. Yet further, field-oxide thinning in narrow isolation spaces is less likely to occur when using the shallow trench process.

While the conventional trench isolation process has many advantages over LOCOS, the trench process also has several problems. A technique known as "lithography" is used to pattern a photosensitive film (i.e., "photoresist") above the region of the substrate to be etched to form the trench. An optical image is transferred to the photoresist by projecting a form of radiation, primarily ultraviolet light, through the transparent portions of a mask plate. The solubility of regions of the photoresist exposed to the radiation is altered by a photochemical reaction so that those regions may be removed when washed with a solvent. In this manner, the portions of the substrate to be removed are exposed while those portions to be retained are protected by the photoresist which remains intact during the etch step. The lateral width (i.e., the distance between opposed lateral edges) of the trench is thus mandated by the lateral width of an overlying photoresist layer. Unfortunately, the minimum lateral dimension that can be achieved for a patterned photoresist layer is limited by, inter alia, the resolution of the optical system (i.e., aligner or printer) used to project an image onto the photoresist. The term "resolution" describes the ability of an optical system to distinguish closely spaced objects. The resolution of modern aligners is mainly dependent upon diffraction effects in which radiation passing past an edge or through a slit on a masking plate spreads into regions not directly exposed to oncoming waves. As such, the features patterned upon a masking plate may not be correctly printed onto photoresist. The images projected onto photoresist may have larger dimensions than their corresponding features on the masking plate.

Since trench formation involves etching the silicon substrate, it is believed that dangling bonds and an irregular grain structure form in the silicon substrate near the walls of the trench. In a subsequent processing step, the active areas of the semiconductor substrate may be implanted with impurity species to form sourcetdrain regions therein. The semiconductor topography may be subjected to a high temperature anneal to activate the impurity species in the active areas and to annihilate crystalline defect damage of the substrate. Unfortunately, impurity species which have a relatively high diffusively, such as boron, may undergo diffusion into the isolation region when subjected to high temperatures. The irregular grain structure may provide migration avenues through which the impurity species can pass from the active areas to the trench isolation structures. Moreover, the dangling bonds may provide opportune bond sites for difflusing impurity species, thereby promoting accumulation of impurity species near the edges of the isolation structures.

It is postulated that the presence of foreign atoms within a trench isolation structure may result in that structure having a relatively high defect density. For example, clusters of foreign atoms may cause dislocations to form in close proximity to the lateral edges of the trench isolation structure. It is believed that the voltage required to cause dielectric breakdown of a trench isolation structure decreases as the defect density (or doping density) within the isolation structure increases. Consequently, when a voltage is applied across a conductor arranged horizontally above the trench isolation structure, dielectric breakdown may occur in those areas of the isolation structure having a high defect and/or doping density. In particular, the configuration of a local interconnect above a trench isolation structure may lead to breakdown at the edges of the isolation structure. Local interconnects are relatively short routing structures, and can be made of numerous conductive elements, e.g., doped polysilicon, or reacted polysilicon ("polycide"). As a result of placing a local interconnect in a misaligned contact opening, current may undesirably pass through the trench isolation structure in close proximity to its edges, electrically linking an overlying local interconnect to the bulk substrate. Furthermore, the threshold voltage near the lateral edges of the trench isolation structure may be reduced, and current may inadvertently flow (i.e., leak) between isolated active areas.

FIG. 1 depicts a cross-section of a semiconductor topography in which a local interconnect 34 extends horizontally above a semiconductor substrate 10 upon and within which are formed transistors 12 and 14. Local interconnect 34 serves to couple a gate conductor 16 of transistor 12 to a source/drain region 22 of transistor 14. This form of coupling is prevalent in, for example, high density VLSI logic and SRAMs. A source/drain region 20 of transistor 12 is isolated from the source/drain region 22 of transistor 14 by a trench isolation structure 24 comprising silicon dioxide ("oxide"). Local interconnect 34 is spaced above substrate 10 by an interlevel dielectric 30 comprising oxide. A conductive contact 32 known as a "buried contact" extends through interlevel dielectric 30 and forms electrical contact between local interconnect 34 and source/drain region 22. Formation of contact 32 may involve etching an opening vertically through interlevel dielectric 30 using conventional optical lithography techniques and, e.g., a plasma etch technique highly selective to the oxide-based interlevel dielectric 30. Unfortunately, misalignment of the photoresist masking layer used to define the opening may occur during optical lithography. As a result of misalignment, a portion of the oxide-based trench isolation structure 24 near the lateral edge of the structure may be removed before complete termination of the etch. Thus, when a conductive material is deposited into the opening to form contact 32, it may become arranged slightly over the peripheral portion of trench isolation structure 24 that was removed during contact etch. The presence of the conductive material at the comer region of isolation structure 24 may cause unacceptable current leakage between source/drain region 20 and source/drain region 22 during the operation of the ensuing integrated circuit.

It would therefore be desirable to develop a technique for forming a trench isolation structure which would be resistant to breakdown when a voltage is applied across a conductor positioned above the isolation structure. Such a trench isolation structure would be less likely to experience current leakage and would properly isolate the active areas which it separates. It would also be beneficial to devise a trench isolation structure that would withstand removal when an overlying interlevel dielectric is being selectively etched. A misaligned contact formed partially upon the trench isolation structure would be less likely to extend down into the structure where it could give rise to unwanted current leakage between the active areas. Yet further, a process is needed in which the minimum lateral width of the isolation structure is not limited by the minimum achievable lateral width of photoresist patterned using optical lithography. Reducing the lateral width of the trench isolation structure would allow for increased circuit complexity and integration density.

SUMMARY OF THE INVENTION

The problems outlined above are in large part solved by the technique hereof for fabricating a trench isolation structure which is partially bound between sidewall spacers having a relatively low dielectric constant, K. The "dielectric constant" of a material is defined as the permittivity of the material normalized to the permittivity of a vacuum. Permittivity of a material reflects the ability of the material to be polarized by an electric field. The capacitance between active areas separated by a dielectric isolation structure is directly proportional to the permittivity of the dielectric. The dielectric constant of the sidewall spacers arranged laterally adjacent the edges of the trench isolation structure is less than that of a conventional trench isolation structure. Accordingly, the dielectric constant of the spacers is less than approximately 3.8.

In an embodiment, sidewall spacers having a low K value are formed upon opposed sidewall surfaces of a masking layer arranged above a semiconductor substrate. Those opposed sidewall surfaces of the masking layer are defined by etching an opening through a portion of the masking layer not covered by lithographically patterned photoresisl The masking layer may comprise a silicon nitride ("nitride") layer arranged upon a relatively thin oxide layer. Formation of the sidewall spacers involves depositing a dielectric having a relatively low K value, followed by anisotropically etching the dielectric. Since ion bombardment of the dielectric occurs more frequently upon horizontal surfaces than vertical surfaces, the sidewall spacers may be formed exclusively upon the sidewall surfaces of the masking layer. Thereafter, a portion of the substrate defined between the sidewall spacers may be anisotropically etched to form a relatively shallow trench interposed between ensuing active areas of the semiconductor substrate. Regions of the substrate disposed underneath the masking layer and the sidewall spacers are protected from ion ablation during the etch. Since ion bombardment is primarily vertically directed, the trench etched into the substrate is defined laterally between the exposed lateral edges of the sidewall spacers. The distance between the exposed lateral surfaces of the spacers is less than the distance between the opposed sidewall surfaces of the masking layer. Therefore, since the distance between the sidewall surfaces of the masking layer is dictated by the minimum feature size that can be printed using optical lithography, the distance between the lateral surfaces of the sidewall spacers is less than that minimum feature size. Accordingly, the presence of the sidewall spacers beneficially provides for formation of a trench with a minimized lateral width and/or area.

An oxide layer may be thermally grown within the trench upon the exposed edges of the substrate, thereby forming an oxide liner at the periphery of the trench. A trench dielectric, e.g., oxide, may then be deposited using chemical vapor deposition ("CVD") into the trench and across the masking layer and the sidewall spacers. A chemical mechanical polishing ("CMP") step may be used to planarize the upper surface of the trench oxide. The CMP step may be performed for the time period required to remove portions of the trench dielectric, the masking layer, and the sidewall spacers a spaced distance above the semiconductor substrate. An upper portion of the resulting trench isolation structure is confined between the sidewall spacers. The sidewall spacers are strategically configured adjacent to the lateral edges of the trench isolation structures. Because the sidewall spacers have a relatively low K value, breakdown near the edges of the trench isolation structure is less likely to occur. The lateral edge of the trench isolation structure underneath the sidewall spacers may include dangling bonds and an irregular grain structure that promote the breakdown of the dielectric structure. The presence of the low K dielectric sidewall spacers and the trench dielectric above lateral ends of the trench isolation structure, however, reduces the capacitance between overlying conductors and the isolation structure. Consequently, dielectric breakdown of the trench isolation structure is less likely to occur. The possibility of current leakage between an overlying conductor and the semiconductor substrate underneath the trench isolation structure is thus reduced. Further, it is less likely that current will flow laterally between active areas isolated by the isolation structure.

In subsequent processing steps, the sidewall spacers may advantageously provide an etch stop which protects the trench isolation structure from being removed. For instance, after a transistor is formed laterally adjacent the isolation structure and an interlevel dielectric is deposited across the topography, the interlevel dielectric may be selectively etched to a source/drain region of the transistor. As mentioned previously, misalignment of the photoresist masking layer that defines the region to be etched may occur such that interlevel dielectric material arranged above the isolation structure is etched. The trench dielectric and the interlevel dielectric may both be composed of oxide. The sidewall spacers which are composed of a material dissimilar from that of the interlevel dielectric are not readily attacked by the chemical etchant used to etch the interlevel dielectric. Thus, the sidewall spacers protect the perimeter of the isolation region from being etched as a result of contact misalignment. Absent spacers, the upper corner of the trench dielectric could be etched, allowing conductive material to become arranged between the isolation structure and the source/drain junction after a contact is formed within the etched opening. Conductive material thusly placed could increase the possibility of unwanted current flow between the source/drain junction and an active area on the other side of the trench isolation structure.

BRIEF DESCRIPTION OF THE DRAWINGS

Other objects and advantages of the invention will become apparent upon reading the following detailed description and upon reference to the accompanying drawings in which.

DETAILED DESCRIPTION OF THE INVENTION

Figure 1:
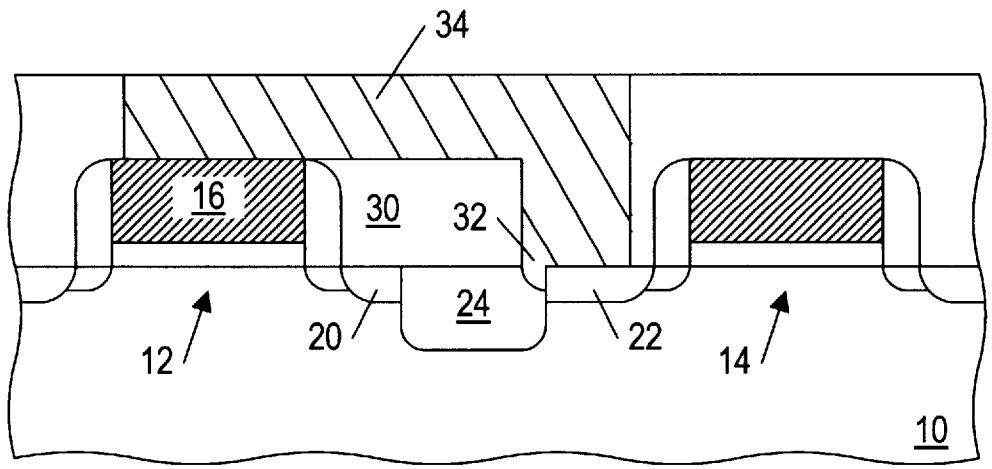
FIG. 1 is a partial cross-sectional view of a semiconductor topography, wherein a local interconnect coupled to a gate conductor of one transistor is electrically linked to a source/drain region of another transistor via a butted contact, according to a conventional design.
Figure 2:
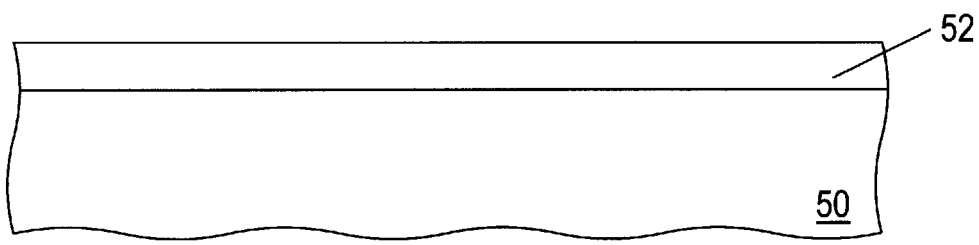
FIG. 2 is a partial cross-sectional view of a semiconductor topography, wherein an oxide layer is formed across a semiconductor substrate, according to an embodiment of the present invention.
Figure 3:
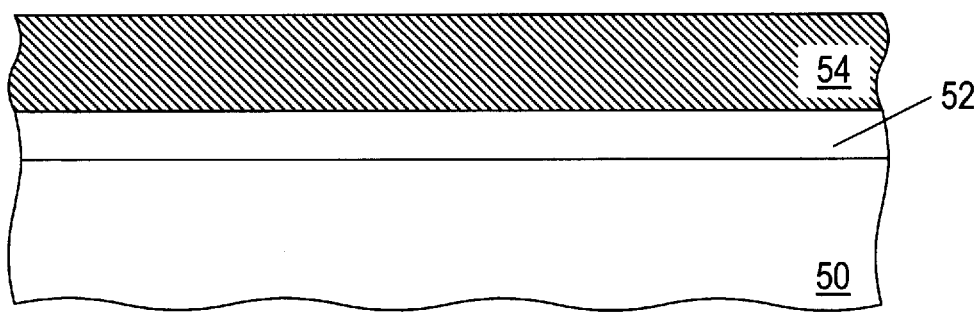
FIG. 3 is a partial cross-sectional view of the semiconductor topography, wherein a silicon nitride layer is deposited across the oxide layer, subsequent to the step in FIG. 2.
Figure 4:
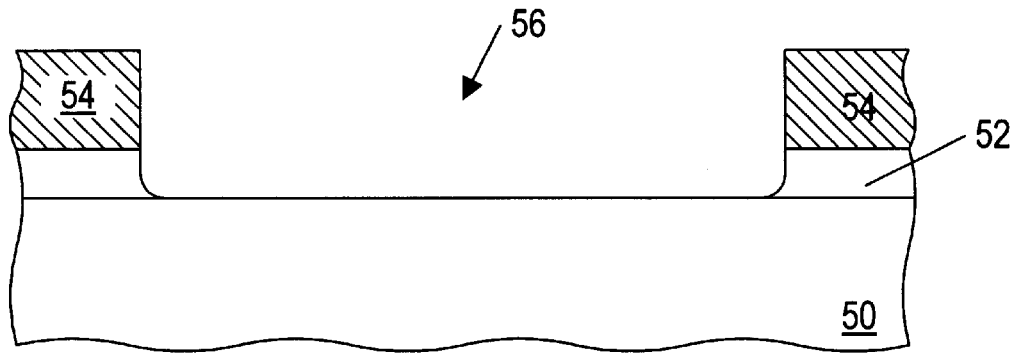
FIG. 4 is a partial cross-sectional view of the semiconductor topography, wherein portions of the silicon nitride layer and the oxide layer are removed from above the semiconductor substrate, subsequent to the step in FIG. 3.

Tuning now to FIG. 2, a partial cross-sectional view of a semiconductor substrate 50 is depicted. Substrate 50 comprises single crystalline silicon slightly doped with n-type or p-type impurities. A silicon dioxide ("oxide") layer 52 is formed across semiconductor substrate 50. Oxide layer 52 may either be thermally grown or deposited by chemical-vapor deposition ("CVD") from, e.g., a silane and oxygen bearing source gas upon substrate 50. As shown in FIG. 3, a silicon nitride ("nitride") layer 54 may be deposited across oxide layer 52. The nitride deposition may be performed using, e.g., a horizontal tube LPCVD reactor. Oxide layer 52 serves as a "pad oxide" between nitride layer 54 and oxide layer 52 by reducing the inherent stresses that exist between CVD nitride and silicon. FIG. 4 depicts an opening 56 being formed through nitride layer 54 and oxide layer 52. A dry plasma etch technique in which the etch duration is chosen to terminate before substantial portions of substrate 50 are removed may be used to form opening 56.

Figure 5:
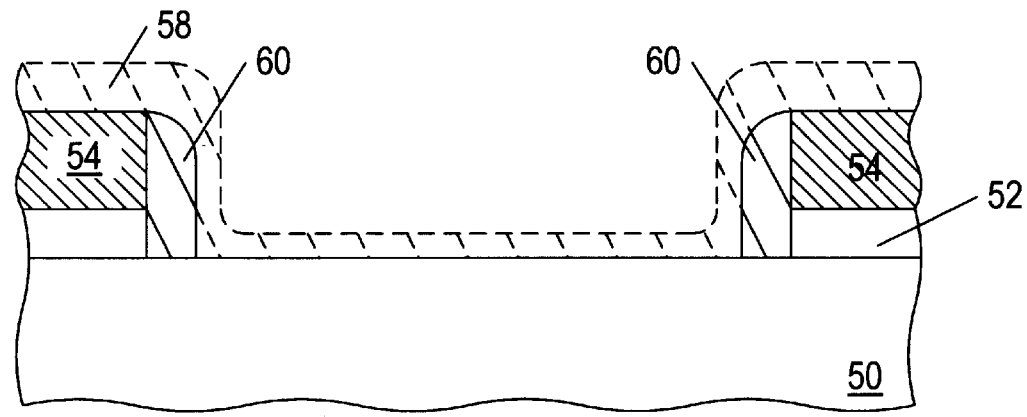
FIG. 5 is a partial cross-sectional view of the semiconductor topography, wherein low K dielectric sidewall spacers are formed upon opposed sidewall surfaces of the masking layer, subsequent to the step in FIG. 4.
Figure 6:
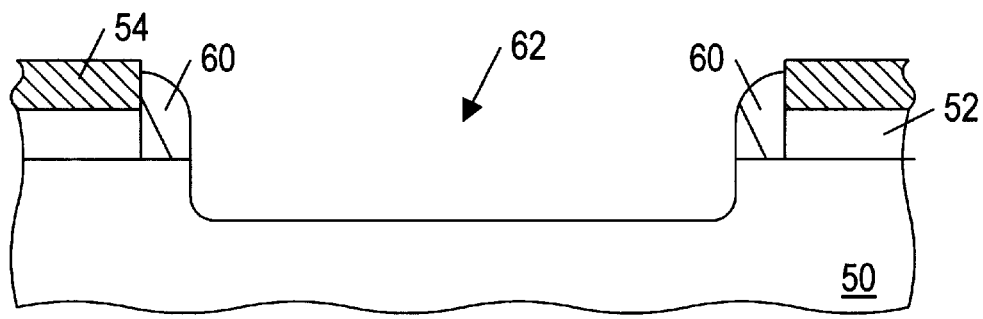
FIG. 6 is a partial cross-sectional view of the semiconductor topography, wherein a region of the semiconductor substrate defined between the sidewall spacers is etched to form a trench, subsequent to the step in FIG. 5.

Turning to FIG. 5, a spacer dielectric 58 may be CVD deposited across exposed surfaces of the semiconductor topography. Spacer dielectric 58 is composed of a material having a dielectric constant, K, that is less than approximately 3.8. Alternately, the low K spacer dielectric 58 may be spin-on deposited across the topological surface. The relatively low K dielectric material may be, but is not limited to, one of the following materials: fluorosilicate glass (FSG), silicon oxyfluoride, hydrogen silsesquioxane, fluorinated polysilicon, poly-phenylquinoxaline, polyqunoline, methysilsesquixane polymer, and fluoro-polymide. Those materials listed above which contain fluorine typically have a K value ranging from approximately 3.0 to 3.8. The polymer-based materials listed above typically have a K value ranging from approximately 2.0 to 3.5. Spacer dielectric 58 may be anisotropically etched to form sidewall spacers 60 upon the opposed sidewall surfaces of nitride layer 54. Since anisotropic etch occurs at a faster rate in a direction perpendicular to the surface being etched rather than parallel to the surface, the etch may be terminated after spacer dielectric 58 has been removed from horizontally oriented surfaces and only remains upon the sidewall surfaces of masking layer 54 and oxide layer 52.

Thereafter, a portion of the silicon-based substrate 50 not masked by nitride layer 54 and sidewall spacers 60 may be anisotropically etched to form a trench 62 within the substrate. Although horizontally oriented surfaces of nitride layer 54 and sidewall spacers 60 may be etched, the vertically oriented surfaces are not substantially removed. Sidewall spacers 60 and the nitride layer 54/oxide layer 52 structure are not completely removed down to the upper surface of substrate 50 during the etch step because of their pre-defined vertical thickness. As such, portions of substrate 50 underlying oxide layer 52 and sidewall spacers 60 are not subjected to ion ablation. Therefore, the resulting trench 62 is defined between the exposed lateral surfaces of sidewall spacers 60. The lateral distance between the sidewall surfaces of the nitride layer 54/oxide layer 52 structure is dictated by the minimum lateral dimension of a feature patterned in photoresist by optical lithography. Because sidewall spacers 60 are formed upon the sidewall surfaces of the nitride layer 54/oxide layer 52 structure, the distance between the spacers is less than that of the minimum lateral dimension definable by lithography. Thus, the lateral width of the resulting trench 62 may be reduced to a size less than that of conventionally formed trenches used for trench isolation structures.

Figure 7:
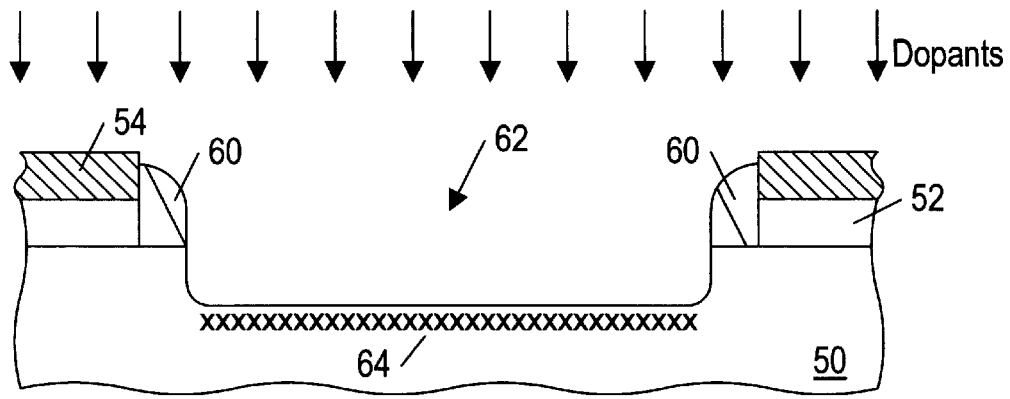
FIG. 7 is a partial cross-sectional view of the semiconductor topography, wherein a channel-stop implant is forwarded into a region of the substrate underlying the trench, subsequent to the step in FIG. 6.

FIG. 7 depicts dopants being implanted into a region 64 of substrate 50 directly below trench 62. The nitride layer 54/oxide layer 52 masking structure and spacers 60 prevent impurity species from entering material beneath those regions. Only the trench 62 which remains exposed between spacers 60, receives the blanket implant. The implant is performed to create a channel-stop doping layer underneath the ensuing trench isolation structure. The type of dopants chosen for the channel-stop implant is opposite to that used during a later implant into active areas laterally separated by trench 62. A $p^+$implant of boron or an $n^+$implant of arsenic, e.g., may be used.

Figure 8:
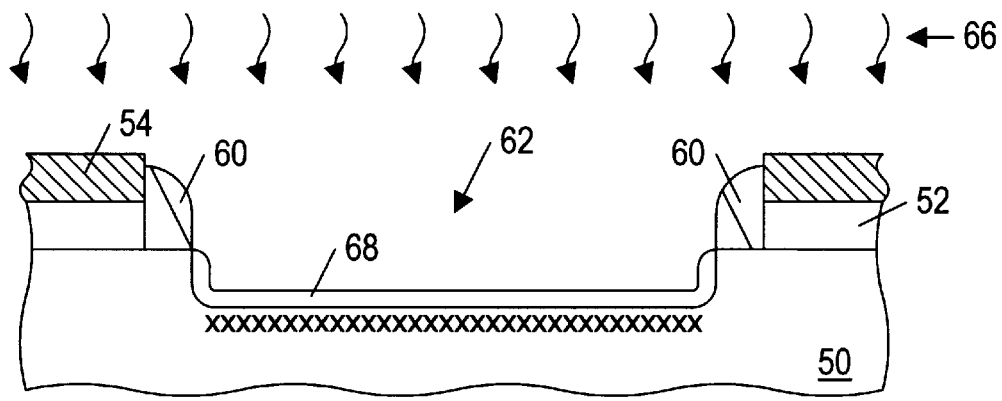
FIG. 8 is a partial cross-sectional view of the semiconductor topography, wherein an oxide liner is thermally grown upon exposed surfaces of the substrate at the periphery of the trench, subsequent to the step in FIG. 7.
Figure 9:
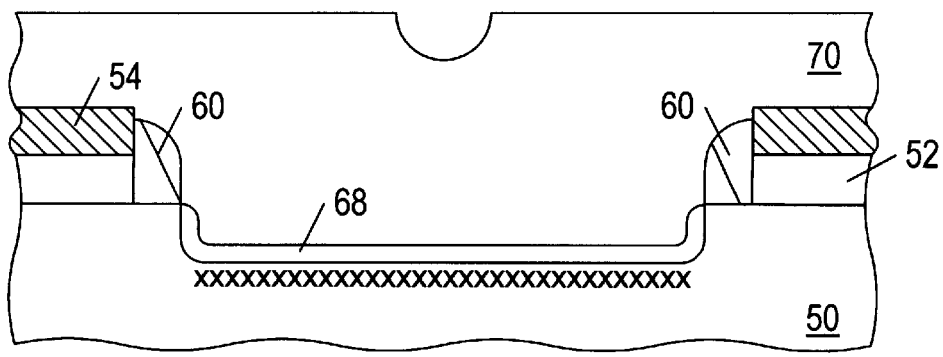
FIG. 9 is a partial cross-sectional view of the semiconductor topography, wherein a trench dielectric is deposited into the trench to a level spaced above the silicon nitride layer, subsequent to the step in FIG. 8.
Figure 10:
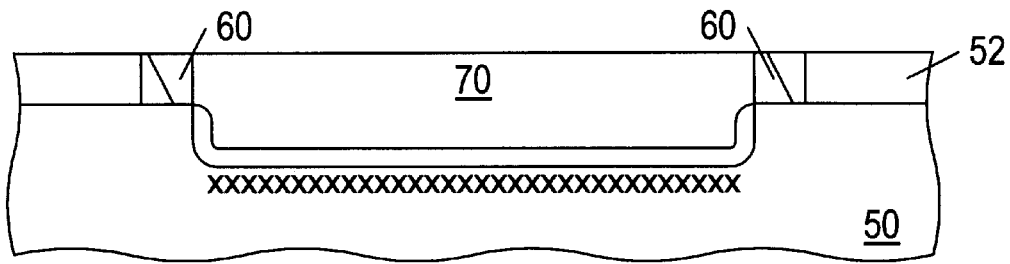
FIG. 10 is a partial cross-sectional view of the semiconductor topography, wherein portions of the trench dielectric, the sidewall spacers, and the nitride are removed down to a level coplanar with or slightly below an upper surface of the oxide layer to form a trench isolation structure between the sidewall spacers, subsequent to the step in FIG. 9.
Figure 11:
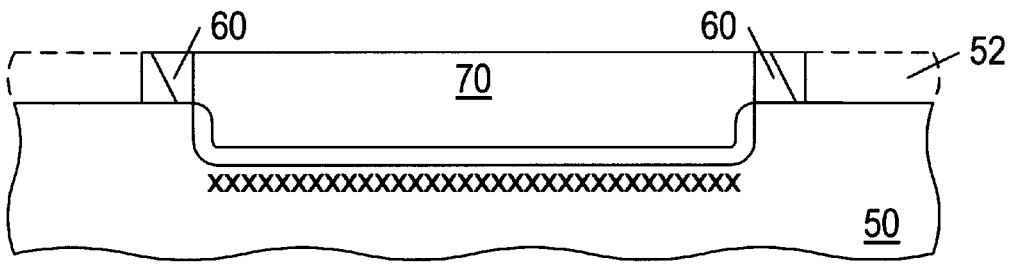
FIG. 11 is a cross-sectional view of the semiconductor topography, wherein the oxide layer is etched from above the semiconductor substrate, subsequent to the step in FIG. 10.

As shown in FIG. 8, the semiconductor topography is then exposed to a form of radiation 66, resulting in the oxidation of exposed silicon within substrate 50. Radiation 66 may be thermal radiation provided from a heated furnace. Alternately, radiation 66 may be radiant light supplied from e.g., an arc lamp or a tungsten-halogen lamp using a technique known as rapid thermal processing ("RTP"). A thermally grown oxide liner 68 is thusly formed at the periphery of trench 62 upon exposed surfaces of substrate 50. FIG. 9 depicts the deposition of a fill dielectric material 70, e.g., CVD deposited oxide across the semiconductor topography. The fill oxide 70 is deposited until its upper surface is at an elevation spaced distance above the surface of nitride layer 54. Turning to FIG. 10, CMP or a combination of etchback and/or CMP may be used to simultaneously planarize the upper surface of the semiconductor topography and remove fill oxide 70, sidewall spacers 60, nitride layer 54, and oxide layer 52 down to a level spaced above the substrate surface. As a result, the vertical thickness of sidewall spacers 60 may be approximately 100 to 600 angstroms. As depicted in FIG. 11, the remaining portions of oxide layer 52 may be removed using optical lithography and an isotropic etch chemistry which exhibits high selectivity to oxide.

Figure 12:
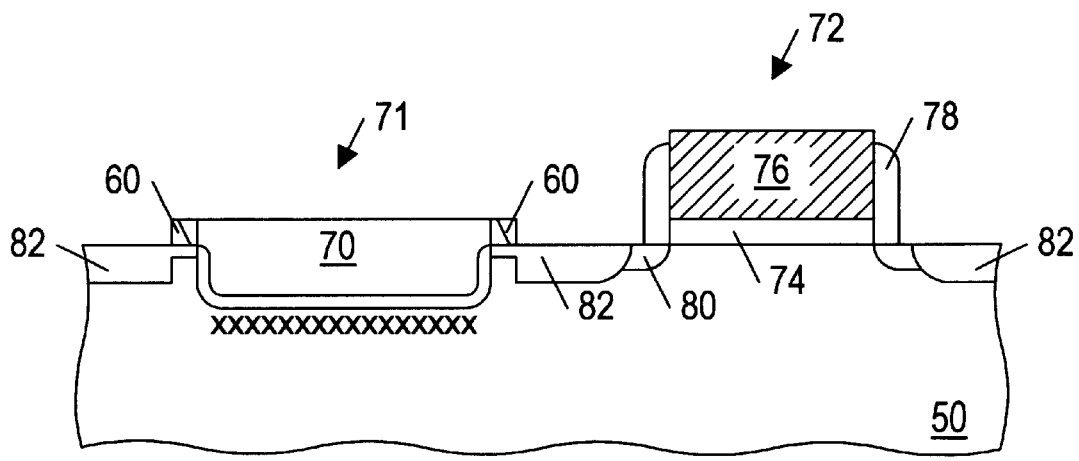
FIG. 12 is a cross-sectional view of the semiconductor topography, wherein a transistor is formed upon and within the semiconductor substrate laterally adjacent the trench isolation structure, subsequent to the step in FIG. 11.

FIG. 12 depicts the semiconductor topography comprising the resulting trench dielectric structure 71 after transistors, such as transistor 72 have been formed within and upon substrate 50. An upper portion of fill dielectric 70 of trench isolation structure 71 is configured between sidewall spacers 60 which have a relatively low dielectric constant. Transistor 72 comprises a doped polysilicon gate conductor 76 spaced above substrate 50 by a gate dielectric 74. Dielectric sidewall spacers 78 are formed upon the opposed sidewall surfaces of gate conductor 76. Lightly doped drain ("LDD") areas 80 are arranged underneath sidewall spacers 78. Heavily doped source/drain regions 82 of transistor 72 are arranged laterally adjacent LDD areas 80 and trench isolation structure 71. Because of their relatively low K value, the presence of sidewall spacers 60 adjacent the lateral edges of fill dielectric 70 reduces the possibility of current leakage within trench isolation structure 70 during operation of the ensuing integrated circuit. Breakdown of trench isolation structure 71 is less likely, despite the presence of defects and impurity species at the lateral edges of the structure. Sidewall spacers 60 may advantageously serve as an etch stop in subsequent processing steps.

It will be appreciated to those skilled in the art having the benefit of this disclosure that this invention is believed to provide a method for forming dielectric structures having a relatively low dielectric constant adjacent to the opposed lateral edges of a trench isolation structure. Further modifications and alternative embodiments of various aspects of the invention will be apparent to those skilled in the art in view of this description It is intended that the following claims be interpreted to embrace all such modifications and changes and, accordingly, the specification and drawings are to be regarded in an illustrative rather than a restrictive sense.

What is claimed is:

1. An integrated circuit comprising:
   a trench dielectric at least partially arranged within a trench of a semiconductor substrate; and
   a first dielectric spacer comprising a material selected from the group consisting of fluorosilicate glass, silicon oxyfluoride, hydrogen silsequioxane, fluorinated polysilicon, poly-phenylquinoxaline, polyguinoline, methysilsequioxane polymer, and fluoro-polymide, wherein the first dielectric spacer is arranged upon a first region of said semiconductor substrate, said first region being positioned laterally adjacent a first lateral edge of said trench dielectric.

2. The integrated circuit of claim 1, further comprising a second dielectric spacer having a dielectric constant less than approximately 3.8 arranged upon a second region of said semiconductor substrate, said second region being positioned laterally adjacent a second lateral edge of said trench dielectric, wherein said second lateral edge of said trench dielectric is arranged laterally opposite said first lateral edge.

3. The integrated circuit of claim 2, wherein an upper portion of said trench dielectric is bound between said first lateral edge and said second lateral edge.

4. The integrated circuit of claim 3, wherein an upper surface of said first and second dielectric spacers and said upper portion of the trench dielectric are substantially planar.

5. The integrated circuit of claim 2, wherein said second dielectric spacer further comprises a material selected from the group consisting of fluorosilicate glass, silicon oxyfluoride, hydrogen silsequioxane, fluorinated polysilicon, poly-phenylquinoxaline, polyquinoline, methysilsequioxane polymer, and fluoro-polymide.

6. The integrated circuit of claim 2, wherein said first and second dielectric spacers both further comprise a first dielectric material.

7. The integrated circuit of claim 1, wherein said trench dielectric comprises a thermally grown oxide liner arranged at a periphery of said trench and a chemically-vapor deposited oxide partially bound by said oxide liner.

8. The integrated circuit of claim 1, further comprising a first active area and a second active area laterally spaced from each other by said trench dielectric.

9. The integrated circuit of claim 1, further comprising implanted channel-stop dopants within a region of said semiconductor substrate directly underneath said trench.

10. The integrated circuit of claim 1, wherein said spacer is in contact with said trench dielectric.

11. The integrated circuit of claim 1, wherein said spacer comprises a vertical thickness of approximately 100 to 600 angstroms.

* * * * *